United States Patent
Lee et al.

(10) Patent No.: US 6,716,735 B2
(45) Date of Patent: Apr. 6, 2004

(54) METHOD FOR FORMING METAL LINES OF SEMICONDUCTOR DEVICE

(75) Inventors: Jae Suk Lee, Seoul (KR); Young Sung Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/327,858

(22) Filed: Dec. 26, 2002

(65) Prior Publication Data

US 2003/0124860 A1 Jul. 3, 2003

(30) Foreign Application Priority Data

Dec. 27, 2001 (KR) .......................... 2001-86380

(51) Int. Cl.[7] .................. H01L 21/3205; H01L 21/4763
(52) U.S. Cl. ...................... 438/592; 438/597; 438/586
(58) Field of Search .................. 438/586, 592, 438/597, 625, 669, 687, 688, 631, 761, 926

(56) References Cited

U.S. PATENT DOCUMENTS

2003/0199138 A1 * 10/2003 Mao et al. .................. 438/240

* cited by examiner

Primary Examiner—Richard Elms
Assistant Examiner—Beth E. Owens
(74) Attorney, Agent, or Firm—Jacobson Holman PLLC

(57) ABSTRACT

After first metal lines and a first inter-metal dielectric are formed on a semiconductor substrate, top surfaces thereof are planarized to construct a flat plane. Then, second metal lines each being vertically aligned with a corresponding first metal line are formed on the flat plane, so that integral metal lines of a high aspect ratio are constructed. Gaps formed by the second metal lines are filled with a second inter-metal dielectric, which is joined with the first inter-metal dielectric to construct an integral inter-metal dielectric.

14 Claims, 4 Drawing Sheets

METHOD FOR FORMING METAL LINES OF SEMICONDUCTOR DEVICE

FIELD OF THE INVENTION

The present invention relates to a method for forming high aspect ratio metal lines of a semiconductor device.

BACKGROUND OF THE INVENTION

A more densely integrated semiconductor device needs high aspect ratio metal lines having narrower gaps filled with a dielectric substance. The narrow gaps, however, are difficult to fill and therefore can lead to unwanted voids and discontinuities in an insulating or gap-fill material.

FIGS. 1A to 1C illustrate a sequential flow of a conventional process for forming metal lines of high aspect ratio. In FIG. 1A, after a metal layer 1 is prepared on a semiconductor substrate 10, photolithography is performed to form a photoresist pattern 2 on the metal layer 1, which is partially exposed therethrough. Reactive ion etching (RIE) is applied to the metal layer 1 by using the photoresist pattern 2 as a mask and, then, the photoresist pattern 2 in FIG. 1A is removed to form a plurality of metal lines 11 as shown in FIG. 1B, wherein a gap is interposed between adjacent metal lines 11. In FIG. 1C, high density plasma (HDP) is used to form an inter-metal dielectric (IMD) 12 that fills the gaps interposed between the adjacent metal lines 11.

If the metal lines 11 have high aspect ratios, inter-metal dielectric 12 is bridged or pinches off before the gap is completely filled from the bottom thereof. As a result, voids 13 in FIG. 1C may be formed in the inter-metal dielectric 12 and cause serious reliability problems because of the potential for trapped contamination. Further, if an etch rate is increased during the HDP process to keep the gaps open longer for the purpose of preventing the formation of metal bridges in the gaps, corner clippings 14 may be formed on a top portion of the metal lines 11. These corner clippings 14 also represent a potential reliability issue.

SUMMARY OF THE INVENTION

It is, therefore, an object of the present invention to provide an improved method of forming high aspect ratio metal lines without voids and corner clippings.

In accordance with the preferred embodiment of the invention, there is provided a method for forming metal lines of a semiconductor device, the method including the steps of: forming a first metal layer on a substrate; patterning the first metal layer to form a plurality of first metal lines spaced apart from each other with a gap interposed between adjacent first metal lines; forming a first dielectric layer to fill the gaps interposed among the first metal lines; planarizing the first dielectric layer such that top surfaces of the first metal lines are exposed; forming a second metal layer on the first dielectric layer and the first metal lines; patterning the second metal layer to form a plurality of second metal lines being positioned on the plurality of first metal lines, respectively, wherein each of the first metal lines and a corresponding second metal line form an integral metal line; and forming a second dielectric layer to fill gaps interposed among the second metal lines, wherein the first dielectric layer and the second dielectric layer form an integral dielectric layer that fills gaps interposed among the integral metal lines.

BRIEF DESCRIPTION OF THE DRAWINGS

The above and other objects and features of the present invention will become apparent from the following description of a preferred embodiment given in conjunction with the accompanying drawings, in which.

DESCRIPTION OF THE PREFERRED EMBODIMENT

Figure 1A:
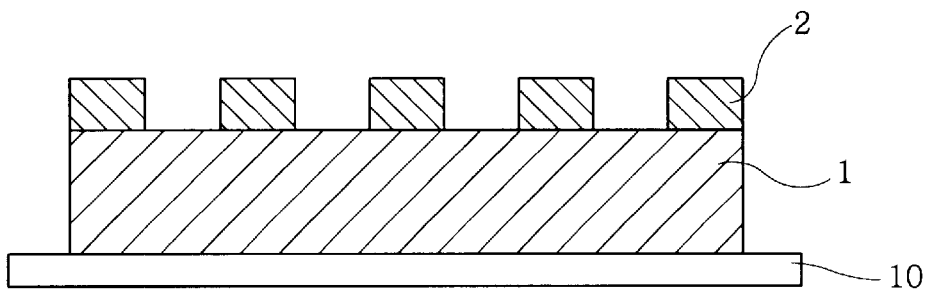
FIGS. 1A and 1C are cross-sectional views illustrating a sequence of a conventional process for forming metal lines of a high aspect ratio.
Figure 1B:
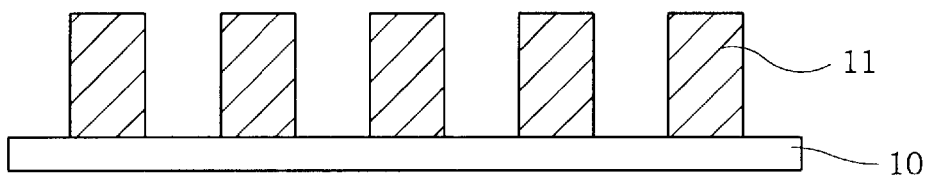
Figure 1C:
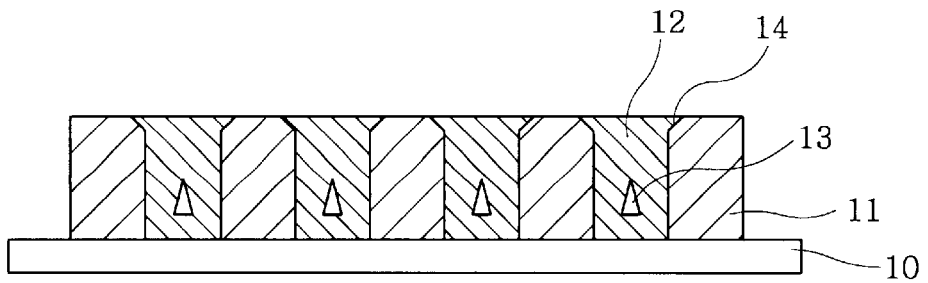

Referring now to FIGS. 2A to 2I, a method of forming metal lines in accordance with the preferred embodiment of the present invention will be described in detail. Like reference numerals represent like parts in the drawings.

Figure 2A:
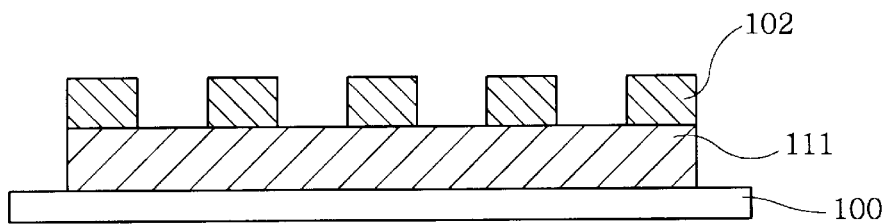
FIGS. 2A to 2I provide cross-sectional views illustrating a sequence of processes for forming metal lines of a high aspect ratio in accordance with the preferred embodiment of the present invention.

In FIG. 2A, after a first metal layer 111 is prepared on a semiconductor substrate 100, photolithography is performed to form a first photoresist pattern 102 on the first metal layer 111, which is partially exposed therethrough. The first metal layer 111 preferably includes a first metal and a second metal sequentially stacked in that order. The first metal is a barrier metal, selected from Ti and Ti/N, serving to prevent the inter-diffusion between the second metal and the substrate. The second metal is selected from aluminum (Al) or aluminum-copper (Al—Cu).

Figure 2B:
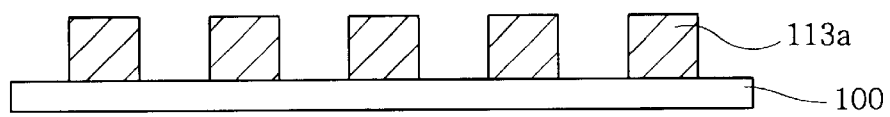

With the first photoresist pattern 102 used as a mask, the first metal layer 111 is etched to thereby form a plurality of first metal lines 113a having a first thickness, as shown in FIG. 2B, wherein a predetermined gap is interposed between every two neighboring first metal lines 113a. Reactive ion etching (RIE) may be used in this etching step. The first metal lines 113a preferably have a moderate aspect ratio to avoid a problem of the formation of metal bridges and the generation of corner clippings during a subsequent gap filling process. The height of first metal lines 113a may be preferably about 50% of a desired thickness of target metal lines.

Figure 2C:
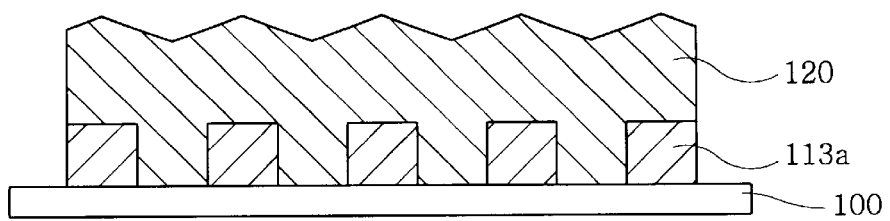

In FIG. 2C, a first dielectric layer 120 is deposited to fill the gaps interposed among the first metal lines 113a. High density plasma chemical vapor deposition (HDPCVD), plasma enhanced chemical deposition (PECVD), or spin on glass (SOG) technology may be used to form the first dielectric layer 120. Since the metal lines 113a have a moderate aspect ratio, the metal bridge and the corner clipping can be avoided in this gap filling step.

Figure 2D:
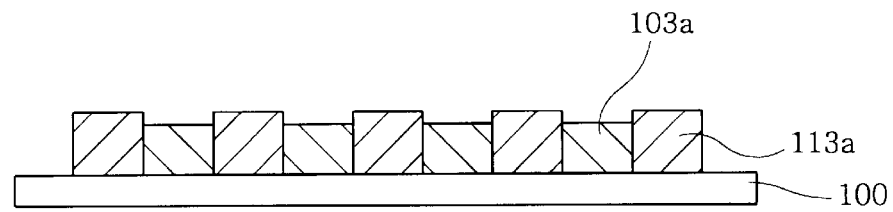

The first dielectric layer 120 is planarized until top surfaces of the first metal lines 113a are exposed as shown in FIG. 2D, while portions of the first dielectric layer 120 are left in the gaps as a first inter-metal dielectric 103a. Chemical mechanical polishing (CMP) may be used with silica-containing slurry in this step, wherein pH of the slurry is preferably over 10 (since the majority of the etched portion is dielectric in this etching step). After the planarization, the first inter-metal dielectric 103a may be lower than the first metal lines 113a, whereby the first metal lines 113a are protruded a little bit over the first inter-metal dielectric 103a.

Figure 2E:
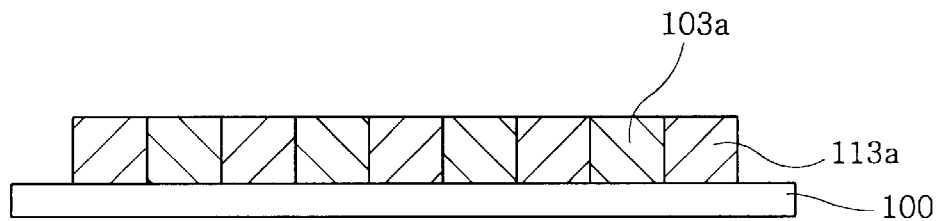

In FIG. 2E, a metal planarization is performed to remove the protruded portions of the first metal lines 113a. As a result, top surfaces of the first metal lines 113a and the first inter-metal dielectric 103a construct a flat plane. CMP may be used with alumina- or ceria-containing slurry in this step, wherein pH of the slurry is preferably below 3 (since the majority of the material etched in this step is metal).

Figure 2F:
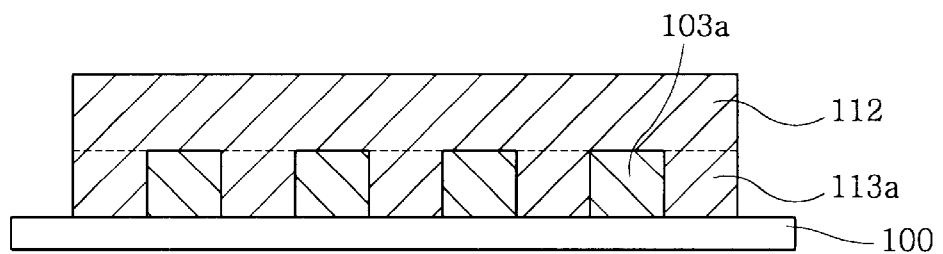

In FIG. 2F, a second metal layer 112 is formed on the flat plane formed by the first metal lines 113a and the first inter-metal dielectric 103a. The second metal layer 112 includes a first metal and a second metal sequentially stacked in that order. The first metal is selected from aluminum (Al) or aluminum-copper (Al—Cu) and the second metal is an ARC metal such as Ti/N and Ti.

Figure 2G:
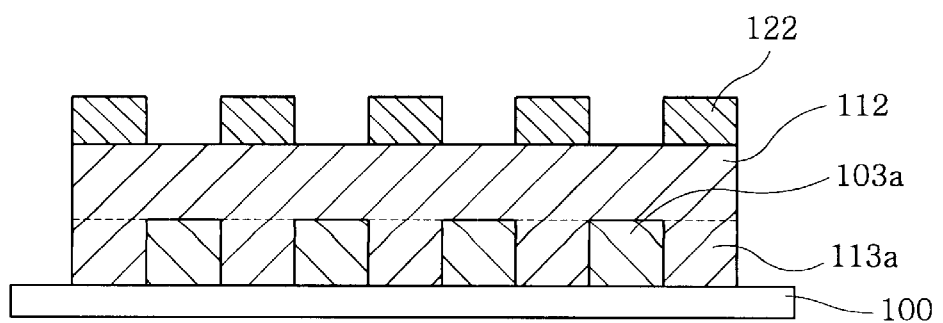
Figure 2H:
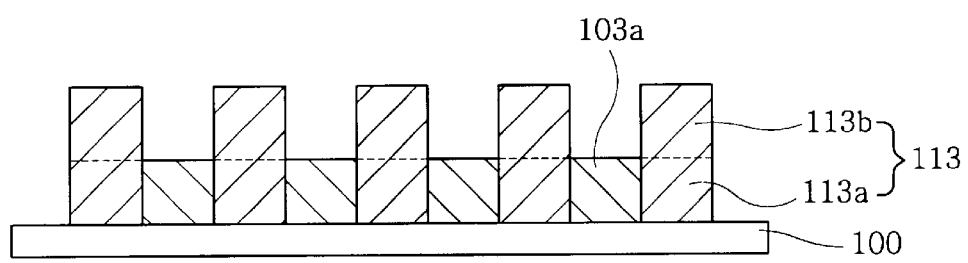

In FIG. 2G, photolithography is performed to form a second photoresist pattern 122 on the second metal layer 112, which is partially exposed therethrough. With the second photoresist pattern 122 used as a mask, the second metal layer 112 is etched to thereby form a plurality of second metal lines 113b having a second thickness that may be equal to the first thickness of the first metal lines 113a, as shown in FIG. 2H. The second metal lines 113b preferably have a normal aspect ratio like the first metal lines 113a to avoid the problem of metal bridges and corner clippings which might occur during a subsequent gap filling process. Each of the second metal lines 113b is vertically aligned with a corresponding first metal line 113a, thereby constructing integral metal lines 113 of a higher aspect ratio. Reactive ion etching (RIF) may also be used in this step.

Figure 2I:
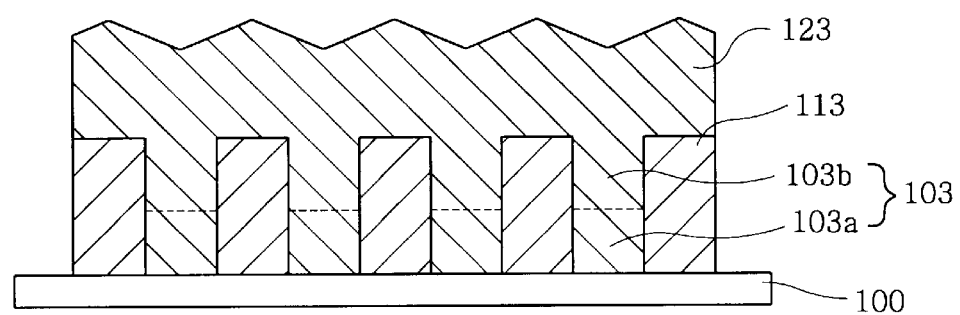

In FIG. 2I, a second dielectric layer 123 is deposited to completely fill gaps interposed among the second metal lines 113b. That is to say, the second dielectric layer 123 includes a second inter-metal dielectric 103b, which fills the gaps formed between the second metal lines 113b in FIG. 2H. The first and the second inter-metal dielectric 103a and 103b construct an integral inter-metal dielectric 103, which can completely fill the gap interposed among the integral metal lines 113 without voids. High density plasma chemical vapor deposition (HDPCVD), plasma enhanced chemical deposition (PECVD), or spin on glass (SOG) technology may be used to form the second dielectric layer 123.

Then, the second dielectric layer 123 is also planarized only to leave the second inter-metal dielectric 103b by applying CMP, which may be the same as being used in the planarizing step described with reference to FIGS. 2C and 2D. The aforementioned process may be repeated to form additional metal lines and inter-metal dielectrics, e.g., third and forth metal lines and inter-metal dielectrics, on the second metal lines 113b and the second inter-metal dielectric 113b.

While the invention has been shown and described with respect to the preferred embodiments, it will be understood by those skilled in the art that various changes and modifications may be made without departing from the spirit and scope of the invention as defined in the following claims.

What is claimed is:

1. A method for forming metal lines of a semiconductor device, comprising the steps of:

forming a first metal layer on a substrate;

patterning the first metal layer to form a plurality of first metal lines spaced apart from each other with a gap interposed between adjacent first metal lines;

forming a first dielectric layer to fill the gaps interposed among the first metal lines;

planarizing the first dielectric layer such that top surfaces of the first metal lines are exposed;

forming a second metal layer on the first dielectric layer and the first metal lines;

patterning the second metal layer to form a plurality of second metal lines being positioned on the plurality of first metal lines, respectively, wherein each of the first metal lines and a corresponding second metal line form an integral metal line; and forming a second dielectric layer to fill gaps interposed among the second metal lines, wherein the first dielectric layer and the second dielectric layer form an integral dielectric layer that fills gaps interposed among the integral metal lines.

2. The method of claim 1, further comprising the step of planarizing the first metal lines after the step of planarizing the first dielectric layer, whereby top surfaces of the first metal lines and the first dielectric layer form a flat plane before the step of forming the second metal layer.

3. The method of claim 2, wherein the step of planarizing the first metal lines is performed by using chemical-mechanical polishing (CMP).

4. The method of claim 3, wherein silica-containing slurry is used for the CMP and pH of the slurry is higher than 10.

5. The method of claim 1, wherein the step of forming the first dielectric layer is performed by using at least one of high density plasma chemical vapor deposition (HDPCVD), plasma enhanced chemical vapor deposition (PECVD), and spin on glass (SOG).

6. The method of claim 1, wherein the step of forming the second dielectric layer is performed by using at least one of high density plasma chemical vapor deposition (HDPCVD), plasma enhanced chemical vapor deposition (PECVD), and spin on glass (SOG).

7. The method of claim 1, wherein the first metal layer includes a barrier metal layer and an aluminum (Al) layer sequentially stacked in that order.

8. The method of claim 1, wherein the first metal layer includes a barrier metal layer and an aluminum-copper (Al—Cu) layer sequentially stacked in that order.

9. The method of claim 1, wherein the second metal layer includes an aluminum (Al) layer and an ARC metal layer sequentially stacked in that order.

10. The method of claim 1, wherein the second metal layer includes an aluminum-copper (Al—Cu) layer and an ARC metal layer sequentially stacked in that order.

11. The method of claim 1, wherein the first metal lines and the second metal lines have an equal thickness.

12. The method of claim 1, wherein the step of planarizing the first dielectric layer is performed by using chemical-mechanical polishing (CMP).

13. The method of claim 12, wherein alumina-containing slurry is used for the CMP and pH of the slurry is lower than 3.

14. The method of claim 12, wherein ceria-containing slurry is used for the CMP and pH of the slurry is lower than 3.

* * * * *